US007616081B2

(12) United States Patent  (10) Patent No.: US 7,616,081 B2
Inaba et al.  (45) Date of Patent: Nov. 10, 2009

(54) TUNER DEVICE

(75) Inventors: Toshihiko Inaba, Akita (JP); Takumi Suzuki, Akita (JP); Kyuichi Sato, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 92 days.

(21) Appl. No.: 11/839,148

(22) Filed: Aug. 15, 2007

(65) Prior Publication Data
US 2008/0068114 A1    Mar. 20, 2008

(30) Foreign Application Priority Data
Sep. 20, 2006    (JP)    ............................. P2006-254377

(51) Int. Cl.
*H03J 5/24*    (2006.01)
*H03J 5/26*    (2006.01)
(52) U.S. Cl. ......................................... 334/85; 361/816
(58) Field of Classification Search .................... 334/85; 361/816, 817
See application file for complete search history.

(56) References Cited

U.S. PATENT DOCUMENTS

| 4,726,789 | A | * | 2/1988 | Yaffe | 439/567 |
| 5,748,449 | A | * | 5/1998 | Tahmassebpur | 361/753 |
| 6,011,700 | A | * | 1/2000 | Matsuzaki | 361/816 |
| 6,388,892 | B1 | * | 5/2002 | Maeda | 361/801 |
| 6,404,309 | B1 | * | 6/2002 | Hall et al. | 334/85 |
| 2002/0149534 | A1 | * | 10/2002 | Bobier | 343/841 |
| 2005/0162242 | A1 | * | 7/2005 | Ootori et al. | 334/85 |
| 2006/0238278 | A1 | * | 10/2006 | Kakiuchi | 334/85 |

FOREIGN PATENT DOCUMENTS

| JP | 06-209268 | 7/1994 |
| JP | 2001-136464 | 5/2001 |
| JP | 2002-344335 | 11/2002 |

* cited by examiner

*Primary Examiner*—Benny Lee
*Assistant Examiner*—Gerald Stevens
(74) *Attorney, Agent, or Firm*—Whitham Curtis Christofferson & Cook, PC

(57) ABSTRACT

A tuner device comprising: a tuner module, disposed on a surface of a substrate and comprising: a circuit component adapted to demodulate a signal received from an antenna device; a printed circuit board mounted with the circuit component and a plurality of connector pins extending perpendicular to the surface of the substrate; and a metallic case, housing the printed circuit board so as to shield the circuit component, and made of an unsolderable material; and a bracket made of a solderable material, and fixed to the metallic case while holding the tuner module so as to dispose the tuner module on the surface of the substrate.

13 Claims, 8 Drawing Sheets

TUNER DEVICE

BACKGROUND

1. Technical Field

The present invention relates to a tuner device for a radio receiver, and more in particular, to a tuner device suitable for a vehicle digital radio receiver for receiving a radio wave transmitted from a satellite (hereinafter, referred to as satellite wave) or an radio wave transmitted from an earth station (hereinafter, referred to as terrestrial wave) so as to listen to digital radio broadcasting.

2. Related Art

Recently, digital radio receivers receiving a satellite wave or a terrestrial wave so as to listen to digital radio broadcasting have been developed and put into practical use in the United States. In general, the digital radio receivers can be mounted in a mobile object such as a vehicle to receive the radio wave in the frequency band of about 2.3 GHz for listening to the radio broadcasting. That is, the digital radio receivers are radio receivers for receiving the mobile broadcasting. Since the frequency of the reception radio wave is about 2.3 GHz, the reception wavelength (resonance wavelength) λ is about 128.3 mm. The terrestrial wave is retransmitted as a linearly-polarized wave by receiving the satellite wave in an earth station and slightly shifting the frequency of the received satellite wave. That is, the satellite wave is a circularly-polarized wave, whereas the terrestrial wave is the linearly-polarized wave.

Thus, in such digital radio broadcasting, since the radio wave having the frequency band of about 2.3 GHz is used, it is necessary to install an antenna for receiving the radio wave outdoors. Accordingly, when the digital radio receiver is mounted on a vehicle, the antenna of the digital radio receiver need be disposed on the roof of the vehicle. Such a vehicle antenna and receiver body (head unit) disposed in the interior of the vehicle are electrically connected to each other via a cable. The head unit serves as an external device. The head unit is also called a user set.

Such a system for receiving the satellite wave or the terrestrial wave includes an antenna unit (antenna device) and a tuner unit (satellite radio tuner). The antenna unit (antenna device) receives the satellite wave or the terrestrial wave and then outputs the received signal at a high frequency. The tuner unit (satellite radio tuner) demodulates the received signal and then outputs a sound signal.

In general, electronic component constituting such a tuner are mounted on a printed circuit board (tuner substrate) and housed in a metallic case (shield case) used commonly as a shield (for example, see Patent Document 1). Patent Document 1 discloses an example in which a tuner device (tuner pack) is fixed perpendicular to a main substrate. The connector pins mounted on the tuner pack are inserted and then soldered to holes formed in a main substrate. In addition, fixation pieces formed in the shield case are introduced into holes formed in the main substrate, and then soldered to the earth patterns formed around the holes.

A configuration of an exemplary satellite digital radio receiver will be described with reference to FIG. 8. The satellite digital radio receiver includes an antenna 101, a tuner unit 102, a signal demodulator 103, a channel demodulator 104, a sound decoder 105, a data decoder 106, a control unit 107, and an operating unit 108 (for example, see Patent Document 2).

Further, a tuner case has been proposed which can be used for both vertical fixation (vertical arrangement) and face-down fixation (horizontal arrangement) (for example, see Patent Document 3). Patent Document 3 discloses that fixation legs are provided to the side surface and the bottom surface (bottom surface) of the tuner case and only a single case, thereby enabling both vertical fixation and face-down fixation by the use of a single case.

Patent Document 1: JP-A-6-209268
Patent Document 2: JP-A-2002-344335
Patent Document 3: JP-A-2001-136464

As disclosed in Patent Document 1, the tuner module is formed of a printed circuit board mounting the circuit component, and a metallic case for housing the printed circuit board so as to shield the circuit component thereon. In the tuner module disclosed in Patent Document 1, the metallic case (shield case) is made of a solderable material. Hence, the tuner module can be vertically disposed in the main substrate by inserting the connector pin and the fixation pieces to the holes (square hole) of the main substrate. Thus, by vertically disposing the tuner module on the main surface of the main substrate, the user's need of utilizing effectively any available space can be satisfied.

On the other hand, in order to form with high precision or without machine finishing, the metallic case (shield case) is sometimes made as an aluminum die-cast body. However, since aluminum is an unsolderable material, it is difficult to vertically install the tuner module on the main surface of the main substrate. As a result, the user's need of utilizing effectively the surplus space can not be satisfied.

In any case, when the metallic case (shield case) is formed of an unsolderable material such as aluminum, in order to vertically install the tuner module, it is necessary to hold the tuner module using any holding means.

Patent Document 3 only proposes a tuner case that can be used as a vertical fixation (vertical arrangement) as well as a face-down fixation (horizontal arrangement), but does not disclose any materials for use in the metallic case (shield case).

In addition, an RF input portion connected to an end portion of a coaxial cable for transmitting a high frequency (RF) signal received at an antenna device. In this case, stress on a soldered portion, originating from vibration or tensile cannot be readily reduced by simply soldering between the end portion of the coaxial cable and the RF input portion.

Further, the tuner device is sometimes packed at the time of shipment while the end portion of the coaxial cable is connected to the RF input portion. However, it is difficult to compactly pack the tuner device due to an obstacle of the coaxial cable. In addition, the tuner device is sometimes soldered by the user on the main surface of the main substrate using a solder deep bath, with the end portion of the coaxial cable connected to the RF input portion. In this case, the coaxial cable is apt to be dropped into the solder deep bath by mistake.

SUMMARY

An object of the invention is to provide a tuner device capable of disposing a tuner module on a main surface of a main substrate, even though a metallic case (shield case) is made of an unsolderable material.

An aspect of the invention provides a tuner device (300; 300A) comprising:

a tuner module (100), disposed on a surface of a substrate and comprising:

a circuit component (21, 22 and 23) adapted to demodulate a signal received from an antenna device;

a printed circuit board (20) mounted with the circuit component (21, 22 and 23) and a plurality of connector pins (25) extending perpendicular to the surface of the substrate; and a metallic case(10), housing the printed circuit board so as to shield the circuit component, and made of an unsolderable material; and a bracket (50; 50A) made of a solderable material, and fixed to the metallic case while holding the tuner module so as to dispose the tuner module on the surface of the substrate.

According to the tuner device (300; 300A) of the invention, the metallic case (10) may be made of aluminum. The bracket (50; 50A), for example, may be made of any one selected from a group consisting of stainless steel and galvanized sheet steel. It is preferable that the metallic case (10) may have first case (11) and a second case (12) each of which is an aluminum die-cast body. In this case, the bracket (50; 50A) may be fixed to the first case (11). The tuner device may have fixation members (701 to 704) for fixing the bracket to the first case. The bracket, for example, may have a plate member (51) opposed to an outer surface of the first case with a predetermined gap therebetween. In this case, the fixation member may include first to N-th fixation screws (701 to 704) (where N is an integer of 2 or more), the first case (11) may have first to N-th screw boss portions (151 to 154) each having a screw hole, which is drilled in the outer surface thereof and can be screwed to one of the first to N-th fixation screws, and the plate member (51) may have first to N-th through-holes at positions corresponding to the first to N-th screw boss portions so as to allow the first to N-th fixation screws to pass therethrough. It is preferable that the first case (11) has a plurality of positioning protrusions (156 to 157) adapted to position the bracket at the outer surface thereof, and the plate member (51) has a plurality of positioning holes (516 and 517) into which the plurality of positioning protrusions are inserted. The first case may be a front case (11), the second case may be a rear case (12), and the plurality of connector pins (25) may protrude downward from the lower side (20*b*) of the printed circuit board (20). In this case, the tuner module (300; 300A) may be vertically disposed on the surface of the substrate. The outer surface of the first case may be a front surface of the front case (11) and the plate member may have a front plate portion (51). In this case, it is preferable that the bracket (50; 50A) has a pair of side plate portions (52 and 53) bent at substantially right angles from both sides of the front plate portion. The bracket may have a plurality of attachment legs (511, 521 and 531) that extend downwardly from the lower sides (51*b*, 52*b* and 53*b*) of the pair of side plate portions and the front plate portion and that are inserted into the plurality of fixation holes formed in the surface of the substrate.

According to the tuner device (300; 300A) of the invention, the printed circuit board (20) may have an RF input portion (209) connected to an end portion of a coaxial cable (91) for transmitting the signal received by the antenna device, adjacent to one (20*d*) of the pair of sides (20*c* and 20*d*) thereof. The bracket (50; 50A) may have a cable holding portion (54; 54A) that extends from one (53) of the pair of side plate portions and that holds the end portion (91*a*) of the coaxial cable adjacent to the RF input portion. The cable holding portion may have a pair of fitting grooves (54*a*). In this case, it is preferable that the tuner device has a holding member (80) fitted to the pair of fitting grooves so as to hold the end portion of the coaxial cable to the cable holding portion. It is preferable that the cable holding portion (54A) has a hook portion (541) on which the coaxial cable can be hooked.

Reference numerals in the parentheses are given to easily understand the invention, but are not limited thereto.

Thus, according to the aspect of the invention, since the bracket, made of an solderable material, for disposing the tuner module on the surface of the substrate is fixed to the metallic case made of an unsolderable material with the tuner module held, it is possible to install the tuner module on the main surface of the main substrate.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Exemplary embodiments of the invention will be described in greater detail hereinafter with reference to the drawings.

Figure 1:
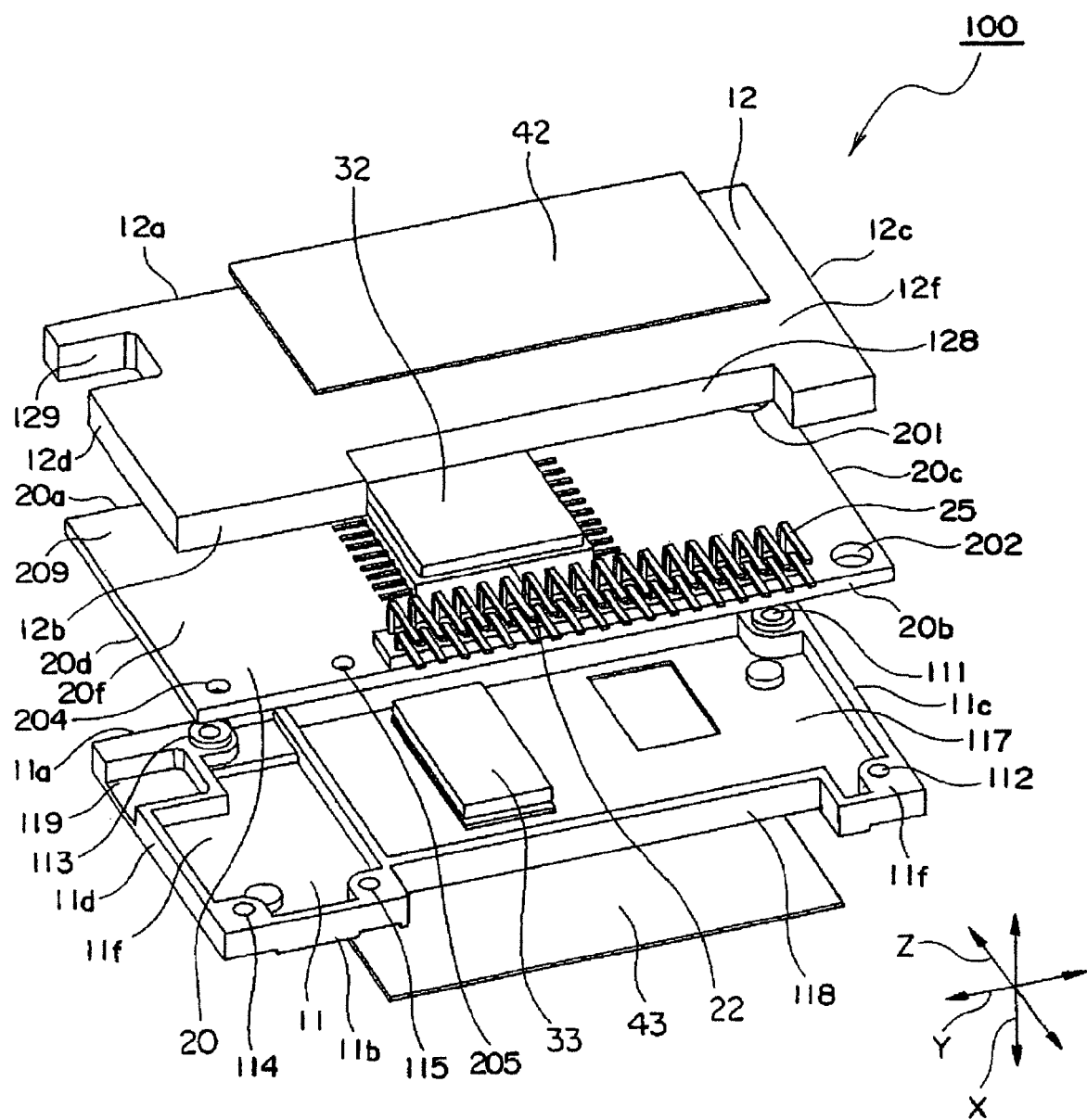
FIG. 1 is a perspective view illustrating a schematic configuration of a tuner module, which illustrates a case where the invention is applied to a tuner module for a vehicle digital radio receiver.
Figure 2:
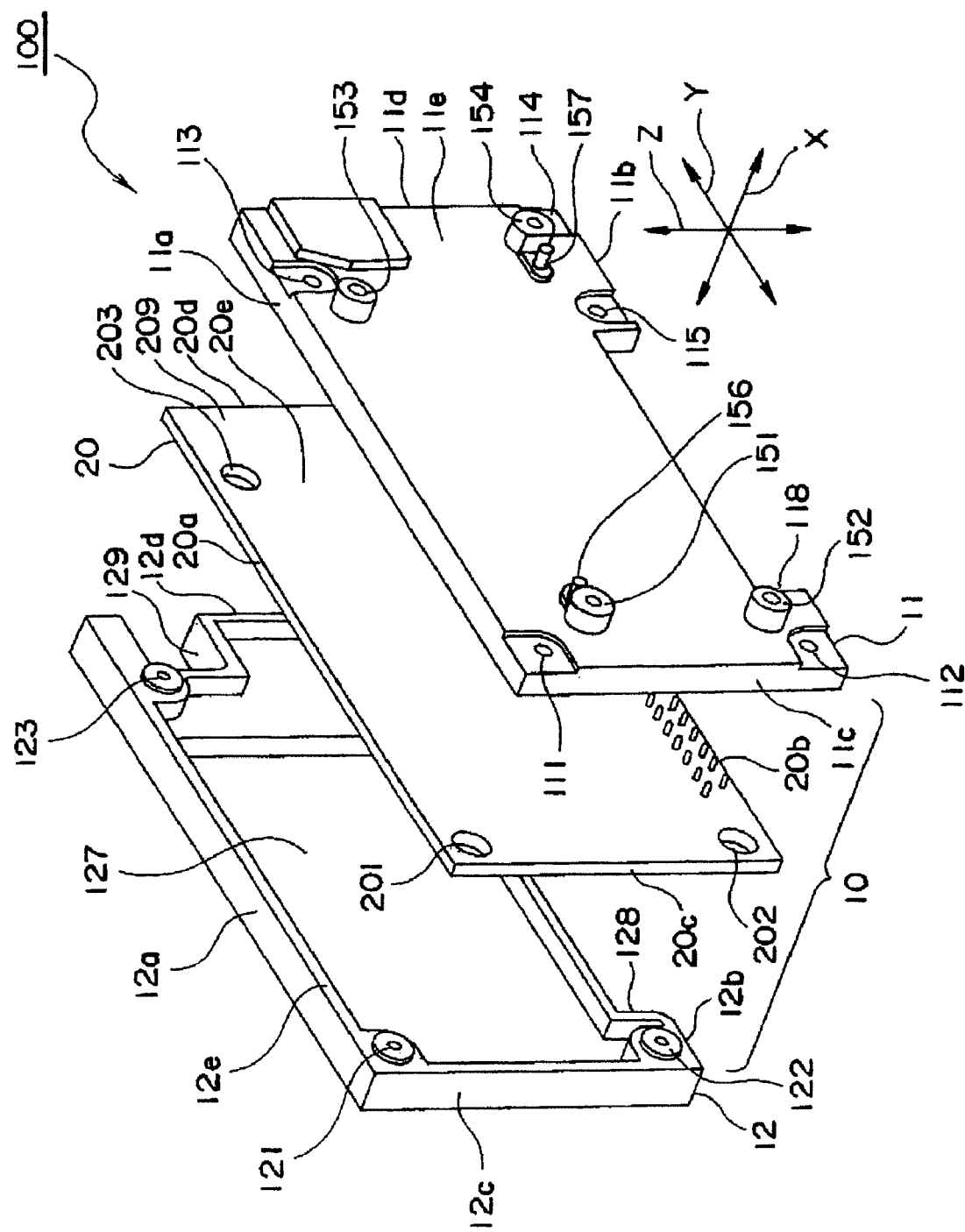
FIG. 2 is a perspective view illustrating a schematic configuration of the tuner module shown in FIG. 1.

First, a tuner module 100 employing the tuner device according to the invention will be described herein below with reference to FIGS. 1 to 3. In FIGS. 1 to 3, an X-direction represents a front-rear direction (depth direction, thickness direction), a Y-direction represents a right-left direction (transverse direction, width direction), and a Z-direction represents an upper-lower direction (height direction).

FIGS. 2 and 3 show a case that a tuner unit, a demodulator, a sound decoder unit, a data decoder unit and controller for controlling them, among the elements constituting the vehicle digital radio receiver are mounted on one printed circuit board, and the printed circuit board is accommodated in the metallic case (shield case). Such a configuration is referred to as a tuner module.

In FIG. 2, the tuner module 100 includes a metallic case (shield case) 10 and a printed circuit board 20. The metallic case (shield case) 10 includes a front case 11 and a rear case 12 each of which is an aluminum die-cast body formed by a die-casting method. As will be described later, since the exemplary tuner device shown is a type that the tuner module 100 is disposed vertically on a main surface of a main substrate, the first case 11 is called as a front case and the second case 12 is called as a rear case.

The front case 11 has a rectangular shape extending substantially parallel with a Y-Z plane defined as the right-left direction Y and the upper-lower direction Z. The front case 11 has an upper side 11a and a lower side 11b opposed to each other in the upper-lower direction Z, and a left side 11c and a right side 11d opposed to each other in the right-left direction Y. The front case 11 has a front surface 11e and a rear surface 11f opposed to each other in the front-rear direction X.

Similarly, the rear case 12 has a rectangular shape extending substantially parallel with a Y-Z plane defined as the right-left direction Y and the upper-lower direction Z. The rear case 12 has an upper side 12a and a lower side 12b opposed to each other in the upper-lower direction Z, and a left side 12c and a right side 12d opposed to each other in the right-left direction Y. The rear case 12 has a front surface 12e and a rear surface 12f opposed to each other in the front-rear direction X.

The printed circuit board 20 has a substantially rectangular plate extending parallel with a Y-Z plane defined as the right-left direction Y and the upper-lower direction Z. The printed circuit board 20 has an upper side 20a and a lower side 20b opposed to each other in the upper-lower direction Z, and a left side 20c and a right side 20d opposed to each other in the right-left direction Y. The printed circuit board 20 has a front surface 20e and a rear surface 20f opposed to each other in the front-rear direction X. The front case 11 is disposed close to the front surface 20e of the printed circuit board 20 and the rear case 12 is disposed close to the rear surface 20f.

The printed circuit board 20 is accommodated in a space between the front case 11 and the rear case 12 other than portions (described later) required to be electrically connected to the exterior so as to achieve shielding. That is, the printed circuit board 20 is fixed using first to fifth substrate-fixing screws (described later) in a state where the printed circuit board 20 is interposed between the front case 11 and the rear case 12.

The front case 11 has first to fifth front screw holes 111, 112, 113, 114 and 115 to which the first to fifth substrate-fixing screws are fitted, respectively. The first front screw hole 111 is provided at the left-upper corner portion of the front case 11. The second front screw hole 112 is provided at the left-lower corner portion of the front case 11. The third front screw hole 113 is provided at the upper side 11a close to the right side 11d of the front case 11. The fourth front screw hole 114 is provided at the right-lower corner portion of the front case 11. The fifth front screw hole 115 is provided at the lower side 11b in a more interior position than that of the fourth screw hole 114.

On the other hand, the rear case 12 has first rear screw boss portion 121 in which a screw hole for fitting the first substrate fixing screw is formed at a position corresponding to the first front screw hole 111. The rear case 12 has a second rear screw boss portion 122 in which a screw hole for fitting the second substrate-fixing screw is formed at a position corresponding to the second front screw hole 112. In addition, the rear case 12 has a third rear screw boss portion 123 in which a screw hole for fitting the third substrate-fixing screw is formed at a position corresponding to the third front screw hole 113. Although not shown, the rear case 12 has fourth and fifth rear screw holes for fitting the fourth and fifth substrate-fixing screws at positions corresponding to the fourth and fifth front screw holes 114 and 115, respectively.

The printed circuit board 20 has first hole 201 in which the first rear screw boss portion 121 is inserted at a position corresponding to the first front screw hole 111. The printed circuit board 20 has a second hole 202 in which the second rear screw boss portion 122 is inserted at a position corresponding to the second front screw hole 112. In addition, the printed circuit board 20 has a third hole 203 in which the third rear screw boss portion 123 is inserted at a position corresponding to the third front screw hole 113. Further, the printed circuit board 20 has fourth and fifth holes 204 and 205 for passing through the fourth and fifth substrate-fixing screws, at positions corresponding to the fourth and fifth front screw holes 114 and 115, respectively.

Figure 3A:
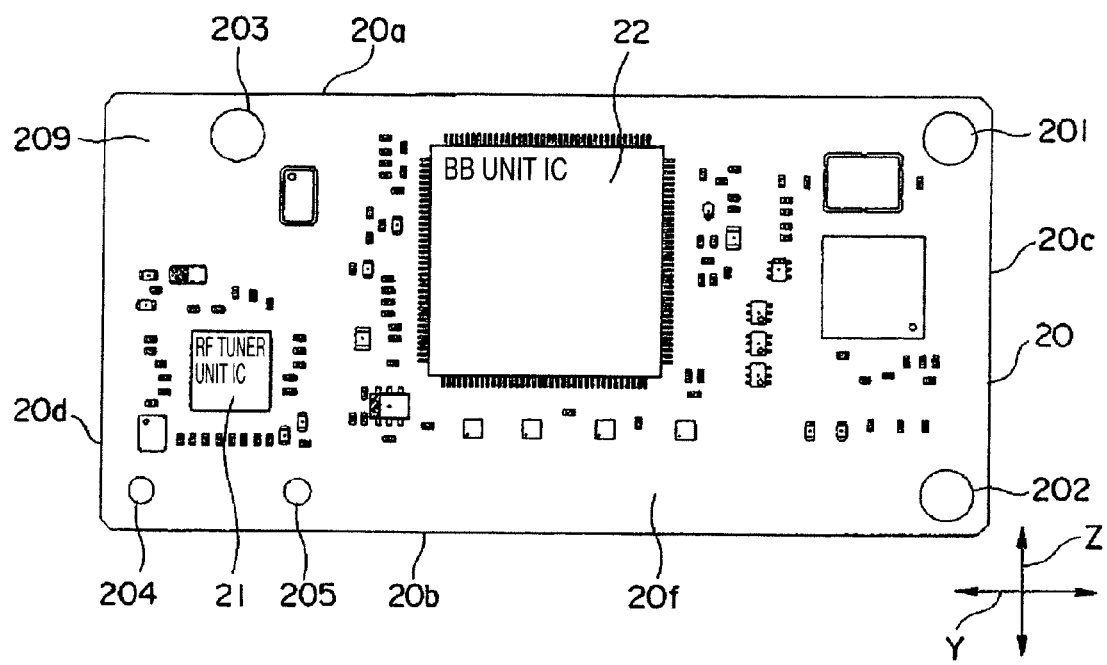
FIG. 3 is a view illustrating a printed circuit board for mounting thereon electronic component constituting the tuner module shown in FIG. 1, where FIG. 3(*a*) is a rear view viewed from the rear surface of the printed circuit board, and FIG. 3(*b*) is a front view viewed from the front surface of the printed circuit board.
Figure 3B:
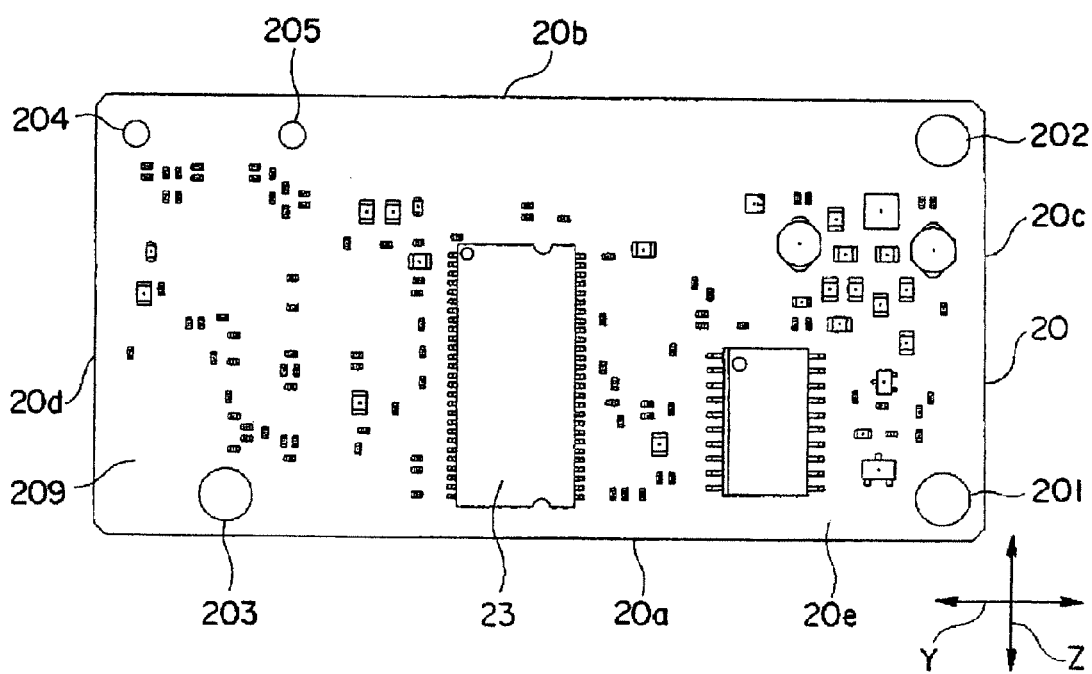

In FIG. 3, electronic component are mounted on the front surface 20e and the rear surface 20f of the printed circuit board 20. FIG. 3(a) illustrates the rear surface 20f of the printed circuit board 20 and FIG. 3(b) illustrates the front surface 20e of the printed circuit board 20. In FIG. 3b, the upper and lower of the printed circuit board 20 are reversely shown.

As shown in FIG. 3(a), first IC component 21 as a main element and a second IC component 22 as a main element of the demodulator are mounted on the rear surface 20f of the printed circuit board 20. In addition, as shown in FIG. 3(b), a third IC component 23 as the main element of the controller is mounted on the front surface 20e of the printed circuit board 20.

As shown in FIG. 1, a recess portion 117 corresponding to the sizes of electronic components or electronic component groups (case where a plurality of electronic components are disposed close to each other) mounted on the printed circuit board 20 is formed on the rear surface (inner wall surface) 11f of the front case 11 coming in contact with the front surface 20e of the printed circuit board 20. Similarly, as shown in FIG. 2, a recess portion 127 corresponding to the sizes of electronic components or electronic component groups (case where a plurality of electronic components are disposed close to each other) mounted on the printed circuit board 20 is formed on the front surface (inner wall surface) 12e of the rear case 12 coming in contact with the rear surface 20f of the printed circuit board 20. Although such a configuration described above is to reduce the thickness of the tuner module 100 as small as possible, a conductive pattern formed on the printed circuit board 20 or a component, where problems may occur due to a short-circuit, may be formed so as not to contact with the metallic case 10 or may be insulated therefrom.

As shown in FIG. 1, heat-conductive sheets 32 and 33 adhere to the upper surfaces (in this case, whole surface) of the second and third IC component 22 and 23 among the first to third IC components 21 to 23 or to the inner surfaces (front surface 12e of the rear case 12 and rear surface 12f of the front case 11) of the metallic case 10 corresponding to the upper surfaces. In order to improve the heat conductivity, the heat-conductive sheets 32 and 33 bring the second IC component 22 in close contact with the front surface (inner surface) 12e of the rear case 12, and also bring the third IC component 23 in close contact with the rear surface 11f (inner surface) of the front case 11, respectively. The material of such a heat-conductive sheet includes, but is not limited to, silicon rubber, acryl rubber, graphite, or the like.

In the outer surface of the metallic case 10, that is, the rear surface (outer surface) 12f of the rear case 12 and the front surface (outer surface) 11e of the front case 11, heat radiating sheets 42 and 43 adhere to the areas including the areas corresponding to the heat-conductive sheets 32 and 33. The adhered areas of the heat radiating sheets 42 and 43 preferably may cover the adhered areas of the heat-conductive sheets 32 and 33, but may not cover the areas of the heat-conductive sheets. An example of such a heat radiating sheet includes, but is not limited to, mixture of liquid ceramic and glass cloth.

With such a configuration, since the heat-conductive sheets 32 and 33 and the heat radiating sheets 42 and 43 are all thin, the total size of the tuner module 100, particularly, the size in the thickness direction X does not increase. The heat generated from the second and third IC components 22 and 23 are conducted to the rear case 12 and the front case 11 through the heat-conductive sheets 32 and 33. The rear case 12 and the front case 11 are made of aluminum having a high heat-conductivity, that is, good heat radiation effect, by the use of a die-casting method. In addition, since the heat radiating sheets 42 and 43 adhere to the outer surface of the metallic case 10, the heat radiation performance is further improved. According to a heat radiation test, it was confirmed that the temperature of the tuner module shown in FIG. 1 decreased by about 10° in comparison with a case where the heat-conductive sheets and the heat radiating sheet was not provided. Further, in a performance test under the atmosphere of 85°, it was confirmed that the tuner module was operated normally.

As shown in FIG. 1, connector pins 25 inserted to the main substrate (not shown) are mounted on the lower side 20b of the printed circuit board 20. In other words, a plurality of connector pins 25 are extended perpendicular to the main surface of the main substrate. The front case 11 has a rectangular front notch portion 118 for a connector at the lower side 11b corresponding to the disposed position of the connector pins 25. Similarly, the rear case 12 has a rectangular rear notch portion 128 for the connector at the lower side 12b corresponding to the disposed position of the connector pins 25.

Further, the printed circuit board 20 has an RF input portion 209 for inputting a high-frequency (RF) signal received from an antenna device (not shown), at the right-upper corner thereof. On the other hand, the front case 11 has a rectangular RF inputting front recess portion 119 at the right side 11d corresponding to the RF input portion 209. Similarly, the rear case 12 has a rectangular rear notch 129 at the right side 12d corresponding to the RF input portion 209.

In addition to FIG. 2, the tuner device 300 according to first exemplary embodiment of the invention will be described herein below with reference to FIG. 4. The tuner device 300 shown has a tuner module 100 shown in FIG. 1, and a bracket 50 for fixing the tuner module 100 to a main substrate (not illustrated) while holding the tuner module 100. The bracket 50 is fixed to the tuner module 100 by the first through the fourth fixation screw 701, 702, 703, and 704. In other words, the first to the fourth fixation screws 701 to 704 serves as a fixation member for fixing the bracket 50 to the front case 11. The material of the bracket 50 includes any one of steel or galvanized sheet iron (galvanized iron sheet). Thus, the bracket 50 can be soldered to the main substrate, unlike the tuner module 100 in which the metallic case 10 is made of aluminum.

As shown in FIG. 2, on the front surface 11e of the front case 11, first to fourth front screw boss portions 151, 152, 153, and 154 having screw holes for fitting the first to fourth screws protrude forwardly from the front surface 11e. The first to fourth front screw boss portions 151 to 154 are provided in the vicinity of the first to fourth front screw holes 111 to 114, respectively. On the front surface 11e of the front case 11, first and second positioning protrusions 156 and 157 for positioning the bracket protrude forwardly from the front surface 11e. The first positioning protrusion 156 is provided in the vicinity of the first front screw boss portion 151. The second positioning protrusion 157 is provided in the vicinity of the fourth front screw boss portion 154.

Referring again to FIG. 4, the bracket 50 has a front plate portion 51 that extends so as to be spaced from the front surface 11e of the front case 11 in the tuner module 100 along the front-rear direction X by a predetermined distance, a right plate portion 52 that extends so as to be spaced from a left surface of the tuner module 100, and a right plate portion 53 that extends so as to be spaced from a right surface of the tuner module 100. In other words, the front plate portion 51 serves as a plate member opposed to and spaced from an outer surface of the first case 11.

The front case 51 has a rectangular shape extending substantially parallel with a Y-Z plane defined by the right-left direction Y and the upper-lower direction Z. The front case 51 has an upper side 51a and a lower side 51b opposed to each other in the upper-lower direction Z, and a left side 51c and a right side 51d opposed to each other along the right-left direction Y. The front case 51 has a front surface 51e and a rear surface (not shown) opposed to each other in the front-rear direction X. The left plate portion 52 is bent backward substantially at a right angle to the left side 51c of the front plate portion 51. The right plate portion 53 is bent backward substantially at a right angle to the right side 51d of the front plate portion 51. In any case, the left plate portion 52 and the right plate portion 53 serve as a pair of side plate portions bent backward at a right angle to both sides 51c and 51d of the front plate portion 51.

The shapes of the left plate portion 52 and the right plate portion 53 are symmetrical to each other. The right plate portion 53 has an upper side 53a and a lower side 53b opposed to each other along the upper-lower direction Z. As shown in FIG. 4, the lower side 53b is longer than the upper side 53a. Similarly, the left plate portion has an upper side 52a and a lower side (not shown) opposed to each other along the upper-lower direction Z.

The front plate portion 51 has a plurality of fixation legs 511 protruded downward from the lower side 51b thereof in a position closer to the left side 51c and the right side 51d than the center, in order to insert it to the fixation holes (not shown) formed in a predetermined position of the main substrate (not illustrated). Likewise, the left plate portion 52 has a plurality of fixation legs 521, protruded downward from the lower side thereof, for inserting it to the fixation hole formed in a predetermined position of the main substrate. The right plate portion 53 has a plurality of fixation legs 531, protruded downward from the lower side 53b thereof, for inserting it to the fixation hole formed in a predetermined position of the main substrate.

Figure 4:
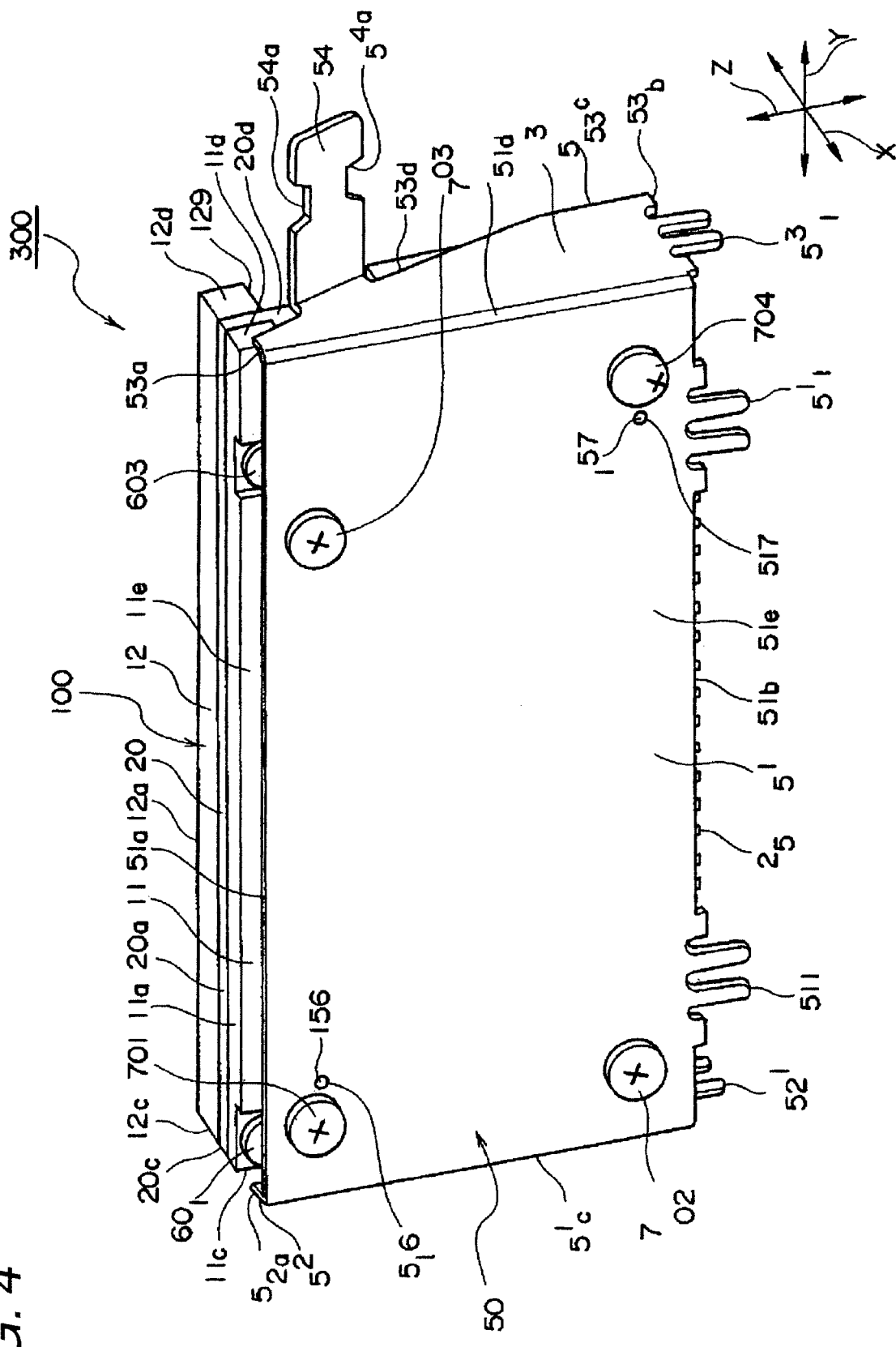
FIG. 4 is a perspective view illustrating a configuration of the tuner device according to the first exemplary embodiment of the invention.

Further, although not shown in FIG. 4, the front plate portion 51 has first to a fourth through holes for individually passing the first to the fourth fixation screws 701 to 704 at the positions corresponding to the first to the fourth front screw boss portions 151 to 154 of the front case 11. In addition, the front plate portion 51 has the first and the second burling holes 516 and 517 each inserted by the positioning protrusions 156 and 157 of the front case 11.

Further, such a tuner device 300 can be manufactured by fixing (fastening) the bracket 50 to the tuner module 100 using the first to the fourth fixation screws 701 to 704, in a condition that the bracket 50 is positioned by individually inserting the first and the second positioning protrusions 156 and 157 to the first and the second positioning burling holes 516 and 517. In this case, since the plurality of fixation legs 511, 521 and 531 are protruded from the lower sides 51b, 52b and 53b of the bracket 50, the tuner device 300 can be readily fixed to the main substrate by inserting these fixation legs 511, 521 and 531 to the fixation holes of the main substrate. Furthermore, The connector pins 25 protruded downwardly from the lower side 20b of the printed circuit board 20 are inserted into wiring patterns formed in the main substrate.

Additionally, by soldering these fixation legs 511, 521 and 531 and the connector pins 25 to the main substrate, the tuner device 300 is vertically fixed and disposed on the main surface of the main substrate. Further, the soldering is performed by immersing the fixation legs 511, 521 and 531 and connector pins 25 in the solder deep bath.

In any case, by fixing the bracket 50 made of solderable materials to the tuner module 100 covered with the metallic case 10 made of an unsolderable aluminum, it is possible to easily install vertically the tuner device 300 on the main surface of the main substrate. In this manner, by vertically disposing the tuner module on the main surface of the main substrate, available space can formed within the user set. As a result, the degree of freedom for a user set design set can be improved.

As shown in FIG. 4, the right plate portion 53 has a rear side 53c that extends upward from an rear end of the lower side 53b along a upper-lower direction Z, and an oblique side 53d diagonally connecting a upper end of the rear side 53c and the rear end of the upper side 53a. The right plate portion 53 has a cable holding portion 54 protruded in left direction from the oblique side 53d along a right-left direction Y, in the vicinity of the RF input portion 209 in printed circuit board 20. The cable holding portion 54 has a pair of fitting grooves 54a for fitting the holding member such as the INSULOK TIES described later. As will be described later, the use of the cable holding portion 54 is to hold the end portion of the coaxial cable.

Figure 5:
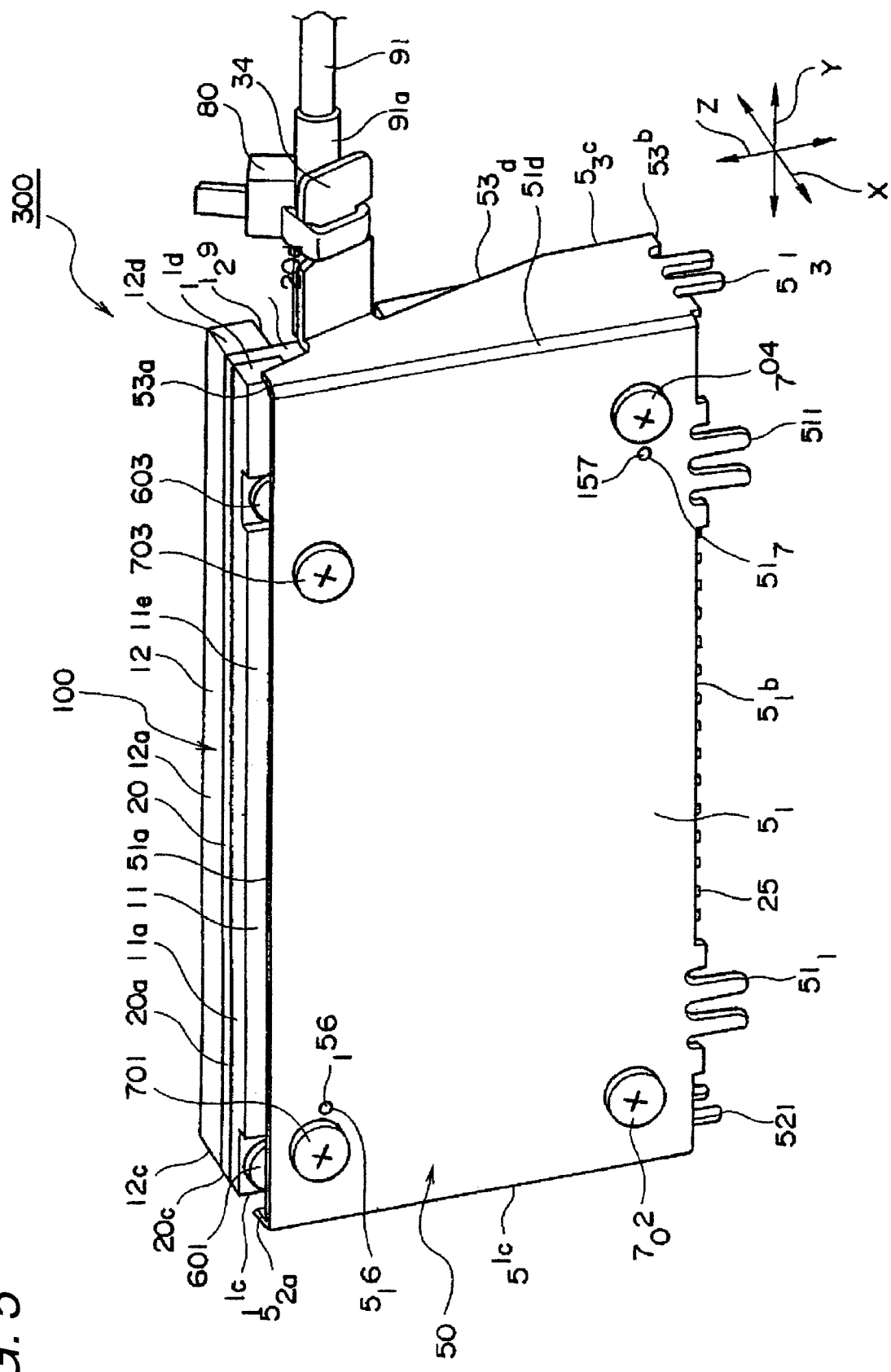
FIG. 5 is a perspective view illustrating a state that the end portion of the coaxial cable is held using the INSULOK TIES at the cable holding portion of the tuner device shown in FIG. 4.

FIG. 5 illustrates a condition that the end portion 91a of the coaxial cable 91 is held in the cable holding portion 54 using a plastic cable tie such as the INSULOK TIES 80. An end portion of the coaxial cable 91 is electrically connected by soldering, in the RF input portion 209 of the above-mentioned printed circuit board 20. The end portion 91a of the coaxial cable 91 is held and fixed to the cable holding portion 54 using the INSULOK TIES 80 fixed to the fitting grooves 54a of the cable holding portion 54. Thus, it is possible to mitigate any stress (vibration, which is originated from a tensile) applied to the soldered portion between the RF input portion 209 of the printed circuit board 20 and the end portion of the coaxial cable 91.

Figure 6:
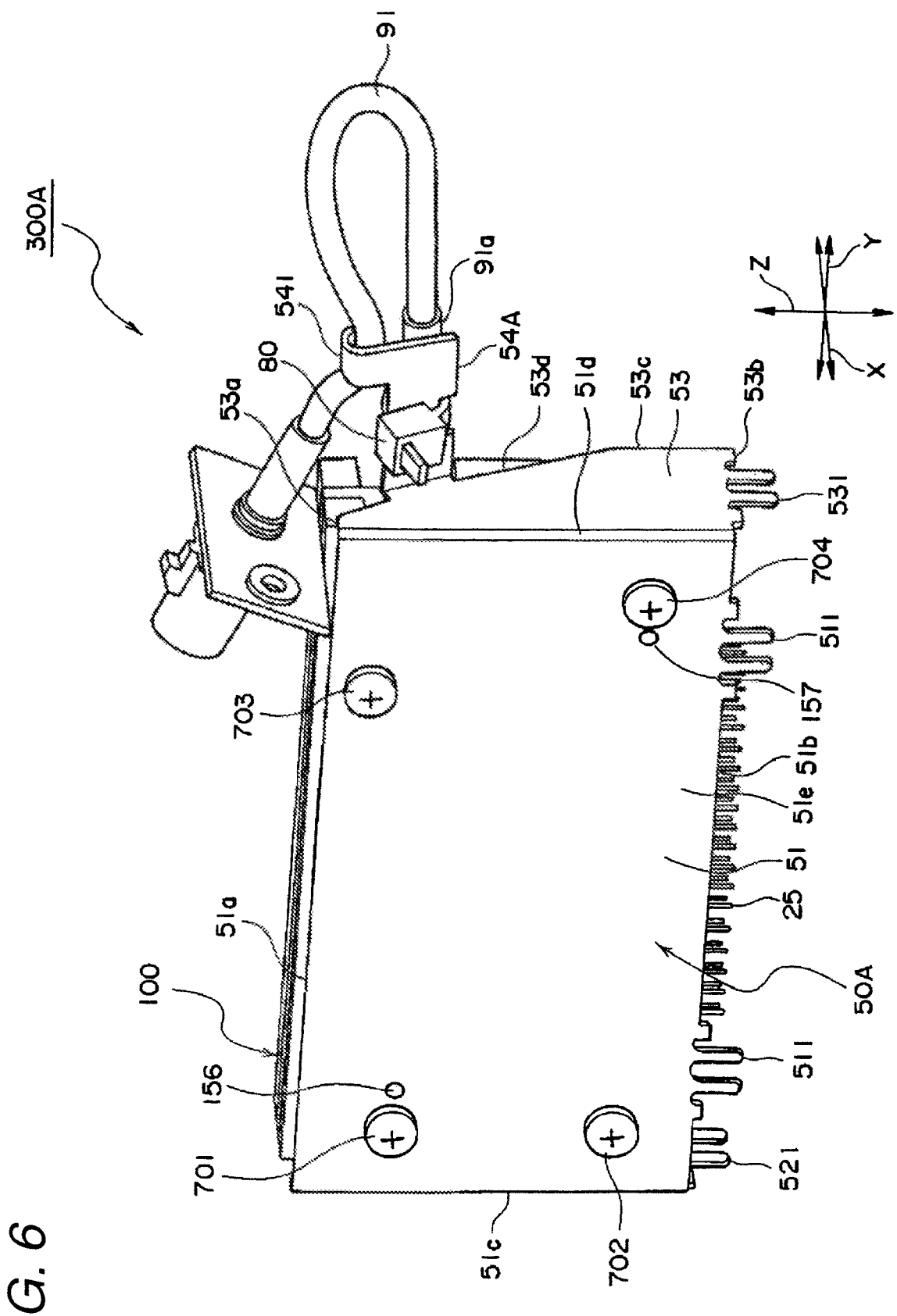
FIG. 6 is a perspective view illustrating a configuration of the tuner device according to the second exemplary embodiment of the invention.
Figure 7:
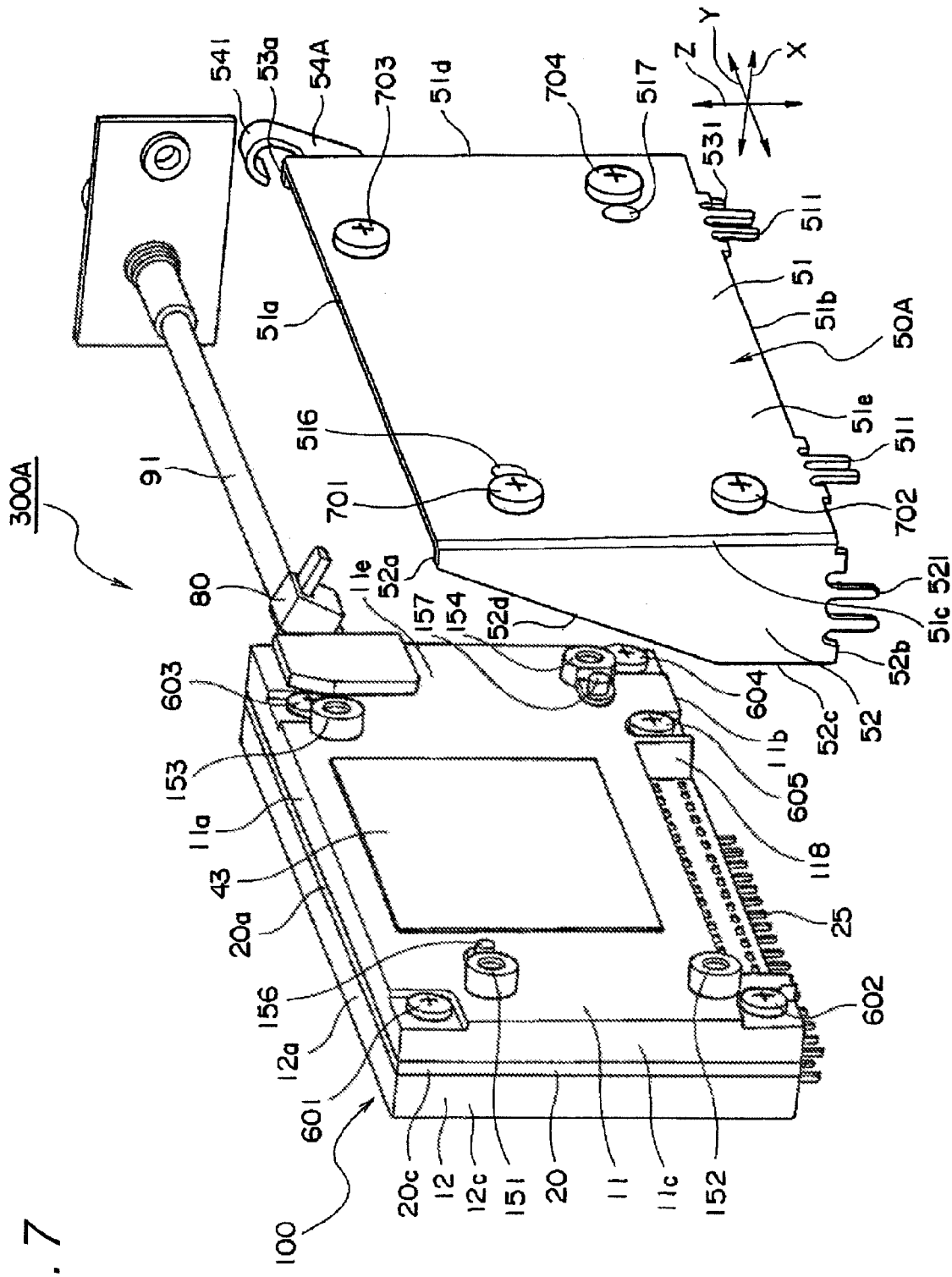
FIG. 7 is an exploded perspective view of the tuner device shown in FIG. 6.
Figure 8:
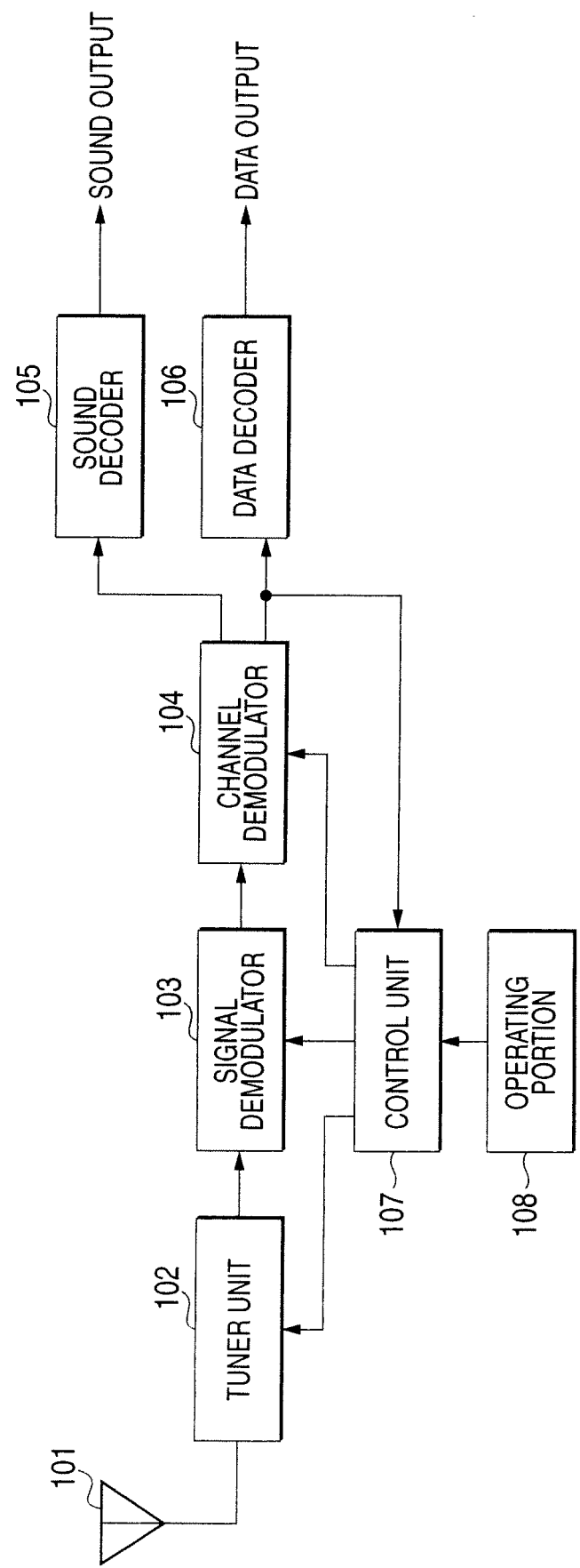
FIG. 8 is a block diagram illustrating a configuration of a satellite digital radio receiver as an example of a digital radio receiver.

The tuner device 300A according to the second exemplary embodiment of the invention will be described herein below with reference to FIGS. 6 to 7. FIG. 6 is the perspective view of the tuner device 300A, and FIG. 7 is an exploded perspective view of the tuner device 300A. The tuner device 300A shown has the same configuration as the tuner device 300, except that the cable holding portion of the bracket is changed from that shown in FIGS. 4 and 5. Therefore, the bracket and the cable holding portion are represented as reference numerals 50A and 54A, respectively. The same reference numerals identify correspondingly in FIGS. 1 to 5, for simplicity, the description thereof will be omitted.

As shown in FIG. 7, the printed circuit board 20 is fixed using first to fifth substrate-fixing screws denoted by reference numerals 601 to 605 while interposed between the front case 11 and the rear case 12.

The cable holding portion 54A has a hook portion 541 for hooking the coaxial cable 91 on the end portion thereof.

Thus, as shown in FIG. 6, such a hooking of the coaxial cable 91 on the hook portion 541 allows compactly packing the tuner device 300A at the time of shipment. In addition, as described above, when the tuner device 300A is fixed and disposed to the main surface of the main substrate by soldering, the fixation legs 511, 521 and 531 and the connector pins 25 in the tuner device 300A is immersed into a solder deep bath. Thus, in this exemplary embodiment, since the coaxial cable 91 is hooked on the hook portion 541, it allows preventing the coaxial cable 91 from falling into the solder deep bath by mistake during soldering.

According to the exemplary embodiments of invention, since a cable holding portion for holding the end portion of the coaxial cable is provided to the bracket around the RF input portion, stress on the soldered portion between the end portion of the coaxial cable and the RF input portion can be reduced.

Further, according to the exemplary embodiments of invention, since a hook portion is provided to the cable holding portion to hook on the coaxial cable, the tuner device can be compactly packed with the coaxial cable connected to the RF input portion. As a result, it allows preventing the coaxial cable 91 from falling into the solder deep bath by mistake during soldering.

While the exemplary embodiments of the invention have been described above, the invention is not limited to the above-mentioned exemplary embodiments. For example, in the above-mentioned exemplary embodiments, although the metallic case (shield case) 10 is made of aluminum, it may be formed of other unsolderable materials. Additionally, although the bracket is made of steel or galvanized sheet iron, it may be formed of other solderable materials.

Further, while a tuner device including a tuner module disposed vertically on a main surface of a main substrate has been described in the exemplary embodiment, the invention is equally applicable to a tuner device including a tuner module disposed horizontally on a main surface of a main substrate. In this case, the first case 11 is used as a lower case and the second case 12 is used as an upper case. An X-direction denotes an upper-lower direction (height direction), a Y-direction denotes a right-left direction (transverse direction, width direction), and a Z-direction denotes a front-rear direction (depth direction, thickness direction). A plurality of connector pins mounted on the printed circuit board are extended downward along a X-axis direction (upper-lower direction) perpendicular to the main surface of the main substrate. The bracket has a plate member that extends downward along an upper-lower direction X so as to be opposed to and spaced from the bottom surface (outer surface) of the lower case 11 by a predetermined distance. A plurality of attachment legs that extend downward along an upper-lower direction X from a front side and a rear side is provided.

While the invention is suitable for, in particular, a tuner device in the vehicle digital radio receiver requiring miniaturization, it also is applicable to any other radio receivers in which the metallic case (shield case) is made of an unsolderable materials and the tuner device is disposed on a main surface of a main substrate.

The entire disclosure of Japanese Patent Application No. 2006-254377 filed on Sep. 20, 2006 is expressly incorporated by reference herein.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the sprit and scope of the invention.

What is claimed is:

1. A tuner device comprising:
   a tuner module, disposed on a surface of a substrate and comprising:
   a circuit component adapted to demodulate a signal received from an antenna device;
   a printed circuit board mounted with the circuit component and a plurality of connector pins extending perpendicular to the surface of the substrate; and
   a metallic case, housing the printed circuit board so as to shield the circuit component, and made of an unsolderable metallic material; and
   a bracket made of a solderable material, and fixed to the metallic case while holding the tuner module so as to dispose the tuner module on the surface of the substrate.

2. The tuner device according to claim 1, wherein the metallic case is made of aluminum.

3. The tuner device according to claim 1, wherein the bracket is made of a material selected from the group consisting of stainless steel and galvanized sheet steel.

4. The tuner device according to claim 2, wherein the metallic case has first and second cases each of which is an aluminum die-cast body, and the bracket is fixed to the first case.

5. The tuner device according to claim 4, wherein the tuner device has a fixation member for fixing the bracket to the first case.

6. The tuner device according to claim 5, wherein the bracket has a plate member opposed to an outer surface of the first case with a predetermined gap therebetween,
   the fixation member includes first to N-th fixation screws, where N is an integer of 2 or more,
   the first case has first to N-th screw boss portions each having a screw hole, which is drilled in the outer surface thereof and can be screwed to one of the first to N-th fixation screws, and
   the plate member has first to N-th through-holes at the positions corresponding to the first to N-th screw boss portions so as to allow the first to N-th fixation screws to pass therethrough.

7. The tuner device according to claim 6, wherein the first case has a plurality of positioning protrusions adapted to position the bracket at the outer surface thereof, and the plate member has a plurality of positioning holes into which the plurality of positioning protrusions are inserted.

8. The tuner device according to claim 6, wherein
   the first case is a front case,
   the second case is a rear case,
   the plurality of connector pins protrude downward from a lower side of the printed circuit board, and
   the tuner module is vertically disposed on the surface of the substrate.

9. The tuner device according to claim 8, wherein the outer surface of the first case is a front surface of the front case,
   the plate member has a front plate portion, and
   the bracket has a pair of side plate portions bent at substantially right angles from both sides of the front plate portion.

10. The tuner device according to claim 9, wherein the bracket has a plurality of attachment legs that extend downward from the lower sides of the pair of side plate portions and the front plate portion and that are inserted into a plurality of fixation holes formed in the surface of the substrate.

11. The tuner device according to claim 9, wherein the printed circuit board has an RF input portion positioned adjacent to one of a pair of sides thereof, and connected to an end portion of a coaxial cable for transmitting the signal received by the antenna device, and
   the bracket has a cable holding portion that extends from one of the pair of side plate portions and that holds the end portion of the coaxial cable adjacent to the RF input portion.

12. The tuner device according to claim 11, wherein the cable holding portion has a pair of fitting grooves and
   the tuner device has a holding member fitted to the pair of fitting grooves so as to hold the end portion of the coaxial cable to the cable holding portion.

13. The tuner device according to claim 11, wherein the cable holding portion has a hook portion on which the coaxial cable can be hooked.

* * * * *